United States Patent [19]

Hörner et al.

[11] Patent Number: 4,816,115
[45] Date of Patent: Mar. 28, 1989

[54] PROCESS OF MAKING VIA HOLES IN A DOUBLE-LAYER INSULATION

[75] Inventors: Eva Hörner, Holzerlingen; Reinhold Mühl, Altdorf; Hans-Joachim Trumpp, Filderstadt, all of Fed. Rep. of Germany

[73] Assignee: International Business Machines Corp., Armonk, N.Y.

[21] Appl. No.: 172,738

[22] Filed: Mar. 23, 1988

[30] Foreign Application Priority Data

Apr. 16, 1987 [EP] European Pat. Off. ........ 87105700.6

[51] Int. Cl.$^4$ ............... B44C 1/22; B29C 37/00; C03C 15/00; C03C 25/06
[52] U.S. Cl. ................... 156/643; 156/644; 156/646; 156/651; 156/655; 156/657; 156/659.1; 156/668; 204/192.36; 204/192.37; 427/38; 427/43.1; 430/316; 430/317; 437/228; 437/235; 437/241
[58] Field of Search ............... 156/643, 644, 646, 651, 156/653, 655, 656, 657, 659.1, 661.1, 662, 668; 252/79.1; 204/102.32, 192.36, 192.37; 427/38, 39, 43.1; 430/313, 316, 317; 437/228, 235, 241

[56] References Cited

U.S. PATENT DOCUMENTS

| 4,518,629 | 5/1985 | Jeuch | 156/653 X |
| 4,532,002 | 7/1985 | White | 156/651 X |
| 4,631,248 | 12/1986 | Pasch | 156/651 X |
| 4,698,128 | 10/1987 | Berglund et al. | 156/643 |

Primary Examiner—William A. Powell
Attorney, Agent, or Firm—Ira David Blecker

[57] ABSTRACT

A method of making via holes in a double-layer insulation of nitride and polyimide. The via holes are made with one photomask only by applying a photoresist process with double exposure, and a multi-step dry etching process. The double exposure, which includes an image-wise exposure followed by blanket irradiation, achieves an edge angle in the photoresist between approx. 60° and 70°, depending on the exposure time ratios. This angle is transferred into the polyimide layer in a dry etching process. In a first etching step with $CF_4$ as etching gas the greater part of the polyimide is removed. For removing the residual polyimide in the via holes there now follows an etching step in $O_2$. Etch bias is thus kept on a very low level. The nitride layer is then etched with $CF_4$ as etching gas, with the etching process being executed in two steps, each followed by an etching step in $O_2$ for laterally shifting the photoresist and the polyimide via the resist angle. By softening the step height a softer profile of the via holes is ensured, which permits very good covering by a second layer of metallurgy.

17 Claims, 4 Drawing Sheets

1 μm

1 μm

PROCESS OF MAKING VIA HOLES IN A DOUBLE-LAYER INSULATION

The invention relates to a process of making via holes in a double-layer insulation which for making such holes uses a photoresist process with double exposure and a multi-step dry etching process. The process in accordance with the invention is used in particular for making via holes in the double-layer insulation between first and second metallurgy of integrated circuit structures in VLSI technology.

In integrated circuit technology, metallurgy patterns for joining the individual structural components were conventionally made in that a metal layer was blanket deposited on a semiconductor substrate which in a photoresist process with subsequent etching was structured in accordance with the respective metallurgy pattern. This pattern was covered with an insulation layer onto which in turn another metallurgy pattern was applied which communicated with the first metallurgy through via holes. With increasing density of the integrated circuits the metallurgy patterns had to be arranged in a smaller and denser scope with respect to their dimensions, with the consequence of increasing irregularities and unevenness of the insulation layers over the metallurgy patterns. When a further metallurgy was deposited on such an uneven insulation layer the consequence was that the metallurgy was thinner over a step in the substrate beneath, which caused an increase of current density in these ares, as well as electromigration failures. There also appeared problems in connection with the photoresist process because a clear and precise exposure and development of the photoresist layers turned out to be impossible with an increasing unevenness of the surfaces.

In the course of the circuit structure miniaturization the above described subtractive etching process was replaced by a so-called metal lift-off process which served to produce metallurgy patterns of greater density. Methods of this type are described e.g. in U.S. Pat. Nos. 3,559,389; 3,849,136 and 3,873,361, the disclosures of which are incorporated by reference here. However, this lift-off process used for making metallurgy patterns does not do away with the above discussed unevenness problem, either.

A method which overcomes these disadvantages is described in U.S. Pat. No. 3,985,597, the disclosure of which is incorporated by reference herein. According to this method, three layers are successively deposited on a substrate, the first two consisting of organic polymeric material, and the third top layer being resistant to reactive ion etching in $O_2$. Subsequently, a photoresist layer is applied, and the inverse pattern of the respective metallurgy pattern is produced by exposure. Following the developing of the resist and the removal of the resulting exposed areas of the third layer, the corresponding areas of the second and first layer are removed by reactive ion etching, a conductive metal with a layer thickness approximating that of the first layer is deposited, the substrate is exposed to a solvent selective to the second layer, and the second and all subsequent layers are lifted off. In this manner, a recessed metallurgy pattern is obtained. Subsequently, a polyimide layer is applied, and in a second sequence of process steps via holes are made in said polyimide layer and the metallurgy pattern for the via is made. Although this method is highly effective, there were difficulties in connection with the further and considerable increase in the density of semiconductor elements, particularly in connection with the increase of the number of metallurgy layers. In order to be able to follow the groundrules and to ensure a satisfactory coverage of metal and insulations on all layers a planar process was developed which is the subject of U.S. Pat. Nos. 4,367,119 and 4,447,824, the disclosures of which are incorporated by reference herein. In the structure obtained in accordance with said method, a composite layer consisting of a lower polimide layer and an upper inorganic, oxygen plasma resistant insulating layer is arranged for insulation on a semiconductor substrate with a conductive metallurgy pattern. The via holes in the composite layer are made by means of reactive ion etching processes.

It has furthermore been found (IBM Technical Disclosure Bulletin, Vol. 27, No. 10A, March 1985, pp. 5835–36, the disclosure of which is incorporated by reference herein) that with double-layer insulations of polyimide and plasma-deposited material, such as SiN, $SiO_2$, $SiN_xO_y$ etc. the gassing out of the polyimide at a temperature of approximately 350° to 450° C. may lead to defects in the superimposed SiN, $SiO_2$ or $SiN_xO_y$ layer in the metallurgy deposited thereon.

A double layer insulation where onto the metallurgy arranged on semiconductor substrates a nitride layer is first applied by plasma deposition and subsequently a polyimide layer by spinning-on, is described in the Conference Report of the International Electron Devices Meeting, Washington, D.C., Dec. 5, 6, 7, 1983, pp. 542–545, R. M. Geffken, the disclosure of which is incorporated by reference herein. For making via holes in insulation layers the limiting factors with respect to a closer via hole arrangement had up to now been the absence of an etching stop on the underlying layers, as well as the definition of the second metallurgy. If therefore insulators are selected having an etching stop on the underlying layer the via holes between the second and first metallurgy could be arranged more closely in that they overlap the lines of the first metallurgy. For both insulators described in the above report these conditions are satisfied, i.e., etching technologies are known with a suitable etching stop on the underlying topography. In the case of the plasma nitride, to give an example, in relation to a number of gas mixtures on the basis of $CF_4$ the etching rate ratio of nitride and the underlying phosphor silicate glass/$SiO_2$ substrate is greater than 10:1. Similarly, wet etching processes on the basis of alkali, or dry etching processes on an $O_2$ basis are known for polyimide, for which the underlying oxide and the first metallurgy serve as an etching stop.

In the technology valid up to now, two photomasks were used for making via holes in the double layer insulation in order to make the holes successively in the nitride layer and in the polyimide layer after that. The disadvantage of this method is that the via hole in the polyimide layer which is made with a mask other than that in the nitride layer is not self-aligned relative to the latter. As the via hole in the polyimide layer is bigger than that in the nitride layer several high steps are formed which have to be covered by the second metallurgy. If only one mask could be used for making the via holes in the double layer a number of process steps could be saved, and self-aligned holes could be achieved through both layers with a better angle and a softer profile, which would very positively influence the covering with the second metallurgy.

It is therefore the object of the invention to provide a method of making via holes in a double-layer insulation by using one photomask only.

This object of the invention is achieved by a combination of process steps which comprises a photoresist process with double exposure and a multi-step dry etching process.

According to the invention, then there is disclosed a method of making via holes in a double-layer insulation, comprising the following steps:

(1) applying a first insulation layer (7) of inorganic material onto a substrate with a first layer of metallurgy (6);

(2) applying a second insulation layer (8) of polymeric material onto the first insulation layer (7);

(3) applying a layer (9) of positive photoresist on the double layer (7, 8) and pre-baking;

(4) image-wise exposing of the photoresist layer (9) and subsequently blanket exposing thereof, and post-baking;

(5) developing the photoresist layer (9) with a basic developer;

(6) reactive ion etching (RIE) with a first etching gas of approximately ⅔ to ¾ of the thickness of the second insulation layer (8) in the areas of the respective via holes exposed by the photoresist mask;

(7) RIE with a second etching gas for completely removing the second insulation layer (8) in the areas exposed by the mask, with the first insulation layer (7) serving as an etch stop;

(8) RIE with the first etching gas approximately half the thickness of the first insulation layer (7);

(9) RIE with the second etching gas to effect via the angle of the resist a lateral shifting of the photoresist (9) and of the second insulation layer (8);

(10) RIE with the first etching gas of the second half of the first insulation layer (7);

(11) RIE with the second etching gas to effect via the angle of the resist a lateral shifting of the photoresist (9) and of the second insulation layer (8); and

(12) stripping the residual photoresist (9).

In the following, the invention will be described in detail with reference to the description and the FIGS. 1 to 10. The figures depict the following: FIG. 1A etching a hole in the nitride layer in accordance with prior art;

FIG. 1B etching a hole in a polyimide layer arranged over the nitride layer in accordance with FIG. 1A;

FIG. 2 a resist mask for making ½ holes in the double-layer insulation;

FIG. 3 the first etching step through the polyimide layer;

FIG. 4 the second etching step through the polyimide layer;

FIG. 5 the first etching step through the nitride layer;

FIG. 6 the second etching step for laterally etching resist and polyimide via the resist angle;

FIG. 7 the third etching step through the nitride layer;

FIG. 8 the fourth etching step for laterally etching resist and polyimide via the resist angle and the stripping of the resist;

FIG. 9 an SEM (scanning electron microscope) photomicrograph of a via hole in the double-layer insulation consisting of nitride and polyimide;

FIG. 10 an SEM photomicrograph of a nitride/ polyimide wall on the first layer of metallurgy.

Owing to some of its properties, plasma nitride is highly suitable for passivating integrated circuits, and as an insulator between individual metal layers. In the layer thicknesses used for insulation purposes the plasma nitride films represent a sufficient barrier for sodium ions and thus protect the underlying components against ionic contamination. Furthermore, plasma nitride is relatively moisture-resistant, a fact which contributes to the stability of integrated circuits. Like a number of other insulators it also comprises properties as high resistivity, low values for charge transport and trapping, and a low to moderate level of stress. There exist suitable process windows for the making of nitride films with the respective physical and electronic properties required. Plasma nitride makes conformable films with quite uniform layer thicknesses over all wafer topographies, so that via holes with a very close tolerance and etch bias can be made.

Polyimides also have a number of characteristic features which make them suitable as insulators between separate metallurgies. It should be noted that contrary to plasma nitride polyimide planarizes the underlying topographies, and thus provides an excellent starting point for the application of the second metallurgy. Another important characteristic is its low dielectric constant of 3.5. Particularly advantageous conditions for the insulation between the very close first metallurgy and the second metallurgy are created when first a nitride layer and subsequently a polyimide layer are deposited.

In accordance with the prior art (FIGS. 1A and 1B), a conformable silicon nitride layer is deposited on a semiconductor substrate with a first metallurgy M 1 following known methods, and by means of photolithography and a dry etching process on the basis of $CF_4$ via holes are made therein whose dimensions determine the via surface from metal 1 to metal 2. Subsequently, a polyimide layer is applied by spinning-on. The via holes in the polyimide layer are defined with a second mask and are thus not self-aligned relative to the holes in the nitride layer. During the reactive ion etching of the via holes in the polyimide layer with $O_2$ several high steps are also formed (I, II FIG. 1B) which have to be covered by the second metallurgy.

With the method in accordance with the invention, self-aligned via holes can be made in a double-layer insulation of nitride and polyimide, by using a photoresist process with double exposure and a multi-step, specific dry etching process, said via holes satisfying the respective groundrules involved and having a soft profile which permits excellent coverage by the second metallurgy, even if evaporated at room temperature. A particular advantage of this method is that the holes can be made in the double-layer with one photoresist mask only.

Making the photoresist mask (9) of FIG. 2 will be described first. The substrate onto which a resist layer approximately 3 to 5 μm thick is applied for the photolithographic process consists of the following: A substrate (1) of monocrystalline silicon with p and n diffusions (not shown); a semi-recessed, thermally grown oxide SROX (2); doped polysilicon (5) applied by chemical vapor deposition under low pressure and determining the channel length of the transistor; spacers (4) of silicon dioxide for diffusions; and insulation (3) of borophosphor silicate glass; a first metallurgy (6) of e.g., Ti and an Al-Cu-Si alloy, defined by a lift-off process with a positive photoresist; a first insulation layer (7) of silicon nitride which typically is approximately 0.2 to 0.8 μm thick, conformable with all wafer topographies and made by plasma deposition from an atmosphere containing silane, ammonia and argon, at a pressure of approximately 1 mbar, a power of 100 watt and a deposition temperature of approximately 300° C. Finally, a second planarizing polyimide insulation layer (8) is made by spinning on the polyimide which typically is approximately 0.8 to 2.0 μm thick.

Onto the polyimide layer (8) a photoresist layer (9) is applied by spinning-on in a thickness of approximately 3.0 to 5.0 μm. As photoresists positive photoresist materials can be used, e.g. a resist produced by Shipley, marketed under the designation Microposit 1450J, and containing a phenol formaldehyde resin and a diazonaphthoquinone inhibitor. Usually, the resist is baked prior to exposure for approximately 20 minutes, at approximately 85° C., and after exposure for approximately 10 minutes at approximately 105° C. According to the invention, the photoresist layer is image-exposed through a projection mask, and subsequently blanket exposed. In practical application, the individual chip fields are image-exposed stepwise in a "direct step on wafer", followed by a blanket exposure of the wafers.

The exposure is effected with a radiation of 436 nm wave length, or with shorter wave lengths. The ratio of blanket exposure duration to image exposure duration is within a scope of approximately 1:2.0 to 1:5, with a ratio of approximately 1:2.5 being preferred. The overall exposure is at any rate approximately 3.0 seconds. Through the exposure process disclosed here, i.e. through the blanket exposure following the image exposure the photoresist is rendered soluble not only in the regions defined by the transparent projection mask regions, but its solubility per se is increased in the upper layers. As a consequence, there will be an edge slope in the photoresist pattern upon developing, i.e. the holes are greater in their upper part than below at the substrate level. Details of the double exposure process are described in European Patent Application No. 0 227 851, the disclosure of which is incorporated by reference herein. Without a double exposure it would be possible to achieve, in stepwise exposure of the individual chip fields, the necessary small dimensions in accordance with the groundrules, but not the required edge angles in the photoresist pattern which are so important for the covering with the second metallurgy. The edge angle depends on the ratio of blanket to image exposure. In the above given ratio of 1:2.5 for blanket to image exposure edge angles are obtained upon the development of the resist between approximately 60° and 70°, preferably approximately 65°. For developing, the above mentioned positive photoresist developers on the basis of sodium metasilicate and sodium phosphate can be used, e.g. the AZ-developer produced by Shipley. Through the double exposure, the photoresist layer is reduced during developing by approximately 30% of the original thickness.

For setting a predetermined edge angle in the photoresist pattern it has been suggested (IBM Technical Disclosure Bulletin Vol. 28, No. 7, December 1985, pp. 3136–3137, A. Bergendahl et al, the disclosure of which is incorporated by reference herein) to heat the photoresist pattern, with the consequence of a photoresist flow and smaller photoresist angles. There follows an ashing with oxygen in an RIE system to ensure a complete resist removal from the image openings. The disadvantage of this method is that depending on the size and density of the openings different photoresist profiles are obtained. With smaller hole openings, there is an overhang and a steep resist edge. A similar result is reached with high hole densities. Therefore, this method cannot be used in connection with the present invention. The TDB disclosure with respect to the multi-step etching is referred to below.

The angle in the photoresist mask of approximately 65° (FIG. 2) is transferred into the polyimide layer (8) in the subsequent etching process. During etching it is important to achieve a good etching profile and a low etch bias simultaneously. The latter ensures that the finished via holes with a size of some microns square show only a small dimension increase (in the order of some tenths of a micron). As the thickness of the polyimide layer varies with the topology of the substrate it should also be made sure that all via holes are open.

According to prior art (IBM TDB, A. Bergendahl et al, above) layers of dissimilar materials can be etched anisotropically in that in a multi-step RIE process the process parameters for successive small increments of etching depth are modified, thus presenting a predetermined profile of the etched opening. To give an example: An $SiO_2$ layer is etched stepwise in that etching steps in $CHF_3$ and $CO_2$ alternate with an ashing of the resist in $O_2$.

The polysilicon layer underneath the $SiO_2$ layer is etched stepwise correspondingly, but using an etching gas on the basis of $NF_3$.

Contrary to this prior art, the polyimide layer in accordance with the invention is not etched in a plurality of small steps, but ⅔ to ¾ thereof are etched through in one single step with an etching gas on the basis of $CF_4$. For decoupling the etching of polyimide and nitride an $O_2$ etching step is added. Subsequently, the nitride is etched stepwise with an etching gas on the basis of $CF_4$, alternating with ashings in $O_2$. In this manner, a minimum etch bias is ensured in the etching of polyimide, and the result is a soft edge profile in the double-layer insulation.

In the following, the etching process will be described in two paragraphs, with reference to FIGS. 3 and 4 for the polyimide and FIGS. 5 to 8 for the nitride. Since owing to its planarizing properties the polyimide shows different layer thicknesses in areas of different topology the via holes are overetched for different durations with a higher etch bias owing to the resist angle being effected in the areas of a thinner polyimide layer. This higher etch bias would subsequently be transferred during etching into the nitride layer, too. In order to keep this dimension inaccuracy as small as possible the polyimide is etched in $CF_4$ (FIG. 3) rather than in oxygen, as before. For both etching gases, the etch rate ratio of resist to polyimide is approximately 1:1, for $CF_4$ however there is practically no etch bias, whereas for $O_2$ there would be an etch bias of approximately 0.5 μm because of a lateral etching through isotropic etching percentage.

The first etching step will be of such a length that the polyimide is etched for ⅔ to ¾ of its layer thickness in one step, i.e. etching is continued until it is just about etched through in its thinnest areas (FIG. 3, right-hand via hole). The etch end point is determined by laser interference. The second etching step is performed in oxygen. In this etching step the nitride is the etch stop. It is of such a length that the nitride is exposed in all via holes (FIG. 4). This oxygen etching step causes an etch bias of up to 0.2 μm per via hole. Following this etching step which decouples the etching of polyimide and nitride the nitride is etched in a multi-step process.

The method used up to now comprised a reactive ion etching in CF$_4$ in one step. The disadvantage of this method consists in that a relatively high step was formed in the nitride, which caused interruptions in the second metallurgy. For that reason, the process in accordance with the invention provides a sequence of at least two vertical reactive ion etching steps in CF$_4$ interrupted by a lateral ashing in oxygen (FIGS. 5, 6 and 7). In a last step, another ashing in oxygen is performed (FIG. 8), with the consequence that the polyimide is again set back relative to the nitride step, and the sharpness of the via hole profile is softened still further. The etch bias in this etching step sequence is extremely low, approximately on the order of less than about 0.1 μm. The reactive ion etching of polyimide and nitride consumed approximately half of the resist thickness, with the majority being consumed during the polyimide etching, and the smallest part during the ashing with oxygen. It is thus made sure that during the entire process there is always sufficient residual photoresist available to prevent an undesirable attack of the polyimide in elevated areas. The remaining photoresist is stripped with N-methylpyrrolidone.

| Method Survey: | Prior Art | Invention |
| --- | --- | --- |
| Nitride deposition | yes | yes |
| Resist pre-treatment | yes | no |
| Resist application | yes | no |
| Exposure, developing | yes | no |
| Etching | yes | no |
| Resist strip | yes | no |
| Polyimide pre-treatment | yes | yes |
| Polyimide application | yes | yes |
| Resist application | yes | yes |
| Image exposure | yes | yes |
| Blanket exposure | yes | yes |
| Developing | yes | yes |
| Etching | yes | yes |
| Resist strip | yes | yes |

Specific Embodiment (A) Photolithographic Process

A positive photoresist TF 20 produced by Shipley on Novolak basis with a diazonaphthoquinone inhibitor and 0.35% Oracet dye (trademark of Ciba-Geigy) in a layer thickness of 4.8 μm is used. The ratio between blanket and image-wise exposure was about 1:2.5, with the blanket exposure taking 0.8 seconds and the image-wise exposure 2.2 seconds. The exposed wafers were post-baked for approximately 10 minutes at 105° C., and subsequently developed with AZ developer, ratio 1:1, up to the end point plus 50%. The resist layer thickness after developing was approximately 3 μm and the edge angle of the photoresist approximately 65° (FIG. 2). The layer thicknesses of polyimide and nitride were 0.85 and 0.4 μm, respectively.

(B) Etching Process

All etching steps are executed successively in a HIPRO parallel plate RIE system. Equally suitable are e.g. hexode RIE systems as AME 8100, or some one-wafer etch devices. The below given RIE parameters are based on experience and have supplied excellent results. If they are used in other RIE systems they might have to be modified, as can be appreciated by one skilled in the art.

| Polyimide (0.85 μm) 1st Step: FIG. 3 | |
| --- | --- |
| Etching Medium CF$_4$ | |
| Flow | 30 sccm |
| Pressure | 65 μbar |
| Power | 300 Watt |

Approximately 0.7 μm polyimide are etched through, which corresponds approximately to 78%. The etch rate ratio of resist to polyimide is 1:1.

| 2nd Step: FIG. 4 | |
| --- | --- |
| Etching Medium O$_2$ | |
| Flow | 40 sccm |
| Pressure | 100 μbar |
| Power | 300 Watt |

Approximately 0.3 μm are etched, with 0.15 μm for etching up to the end point and 0.15 μm for an over-etching.

| Nitride (0.4 μm) 1st Step: FIG. 5 | |
| --- | --- |
| Etching Medium CF$_4$ | |
| Flow | 30 sccm |
| Pressure | 65 μbar |
| Power | 300 Watt |

Approximately 0.25 μm nitride are etched through which corresponds to approximately 60%.

| 2nd Step: FIG. 6 | |
| --- | --- |
| Etching Medium O$_2$ | |
| Flow | 40 sccm |
| Pressure | 100 μbar |
| Power | 200 Watt |

Vertical etching is applied in order to achieve via the resist angle a lateral shifting of the resist and the polyimide by 0.15 μm.

| 3rd Step: FIG. 7 | |
| --- | --- |
| Etching Medium CF$_4$ | |
| Flow | 30 sccm |
| Pressure | 65 μbar |
| Power | 200 Watt |

Vertical etching is applied to achieve via the resist angle a lateral shifting of the resist and of the polyimide by 0.15 μm. To the lateral etching of the polyimide of 0.15 μm respectively in steps 2 and 4 there corresponds a vertical resist removal of 0.3 μm respectively.

Figure 1A:
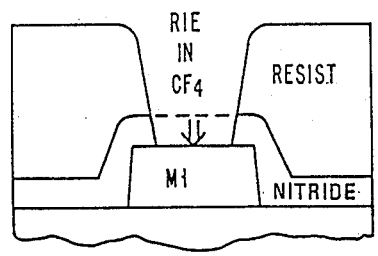
Figure 1B:
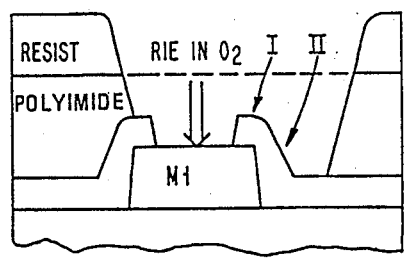
Figure 2:
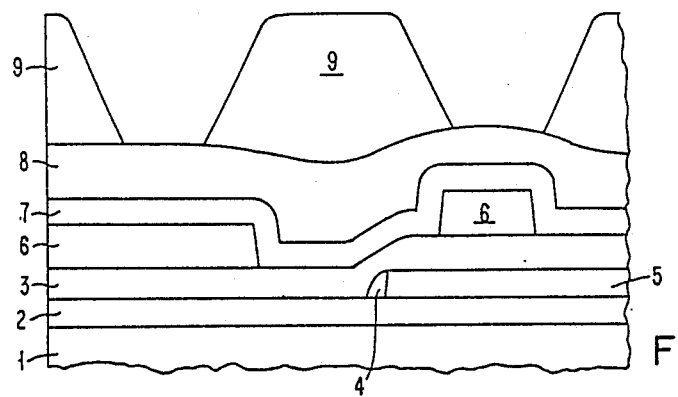
Figure 3:
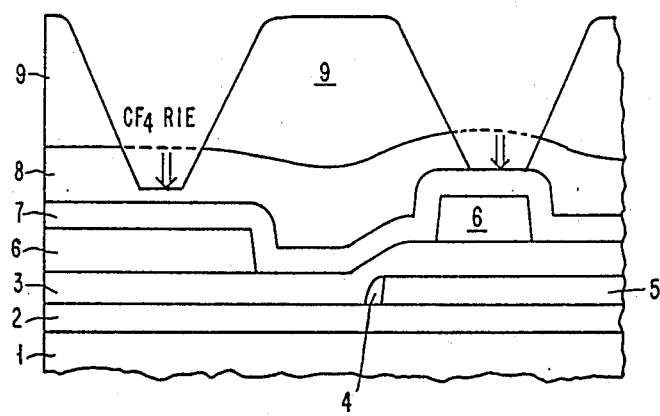
Figure 4:
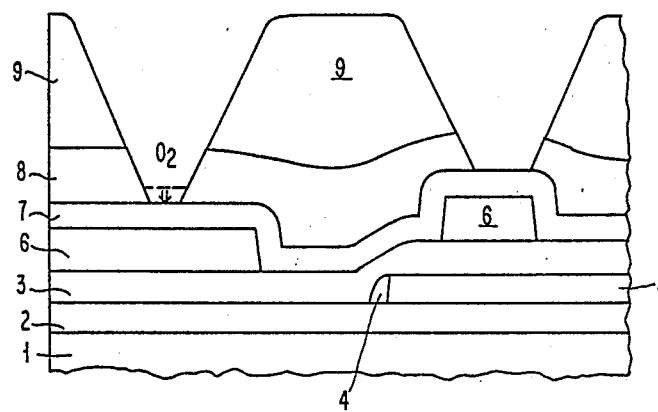
Figure 5:
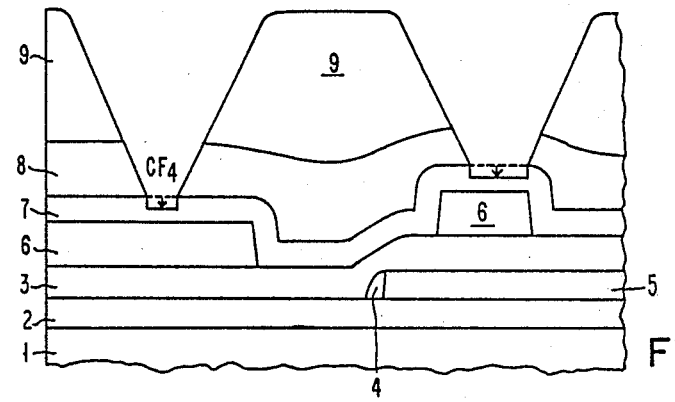
Figure 6:
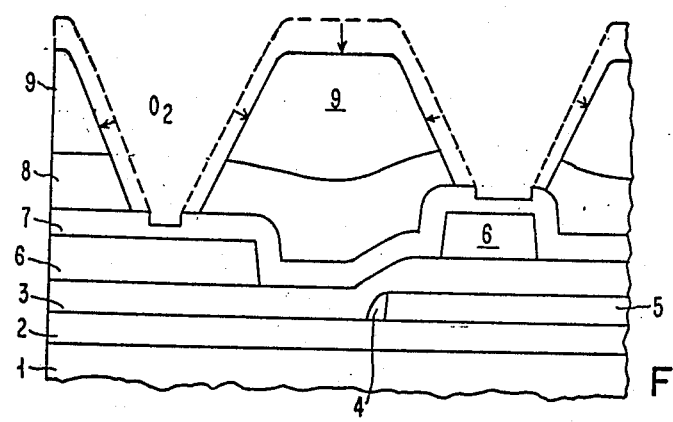
Figure 7:
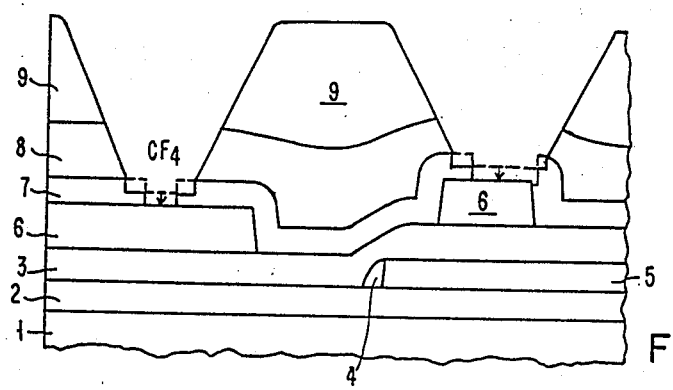
Figure 8:
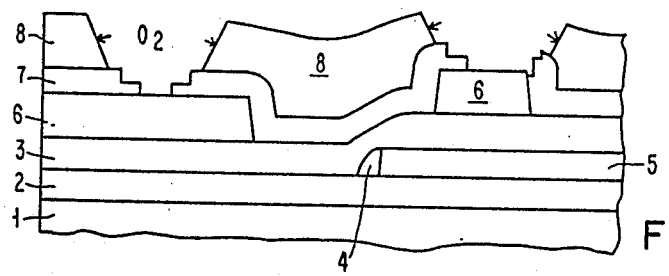
Figure 9:
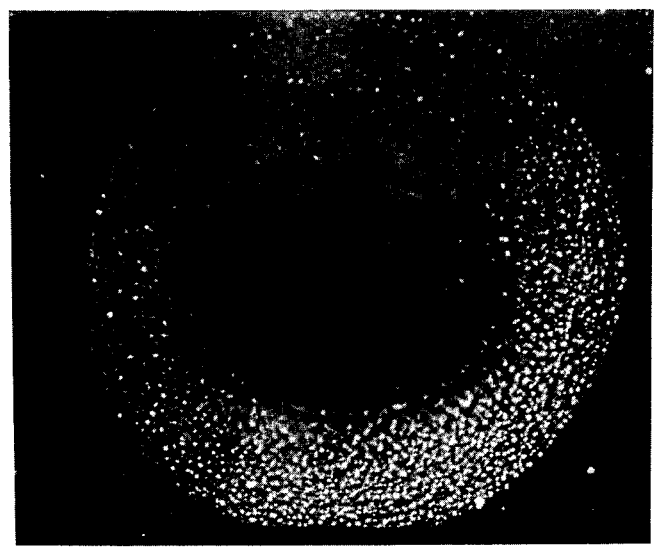
FIG. 9 depicts an SEM illustration of a via hole made in accordance with the invention. The two rings inside the via hole are the nitride steps followed by the polyimide in external direction with a soft profile.
Figure 10:
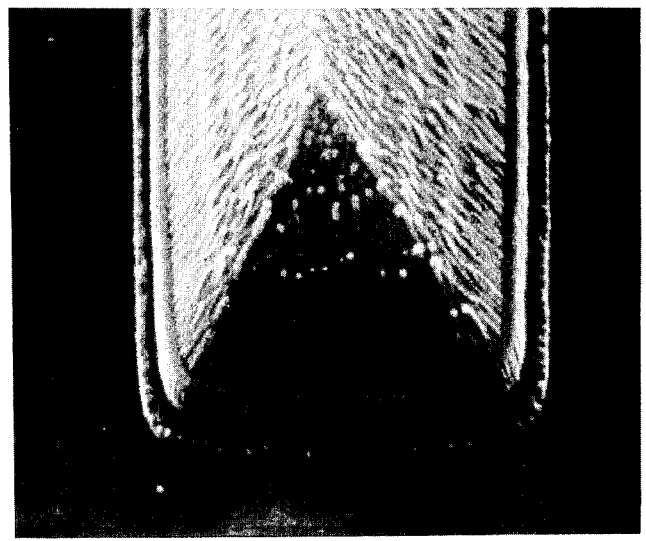
FIG. 10 depicts an SEM illustration, with the dark areas representing the first metallurgy. The first two nitride steps are clearly recognizable in the insulation wall covered by the polyimide with the respective edge angle.

The SEM photomicrographs show the results of a strictly controlled etching process. The angles in the photoresist layer of approximately 60° to 70° are transferred into the polyimide layer with angless less than or equal to 60°, i.e. the profiles become lower during etching. The via holes have soft contours, or low steps, respectively. Due to the self-alignment of the nitride and polyimide opening there is on the whole less topology than in the hitherto known processes (FIGS. 1A and 1B). The external nitride step achieved through the conformal covering of the first metallurgy is missing. The step height of the inner step is less accentuated by being divided into a double step. The etching process in accordance with the invention is particularly advantageous with respect to a satisfactory metal coverage, especially when using the metal lift-off process, or in metal vapor deposition, e.g. of Ti-Al-Cu at room temperature. The via holes made in accordance with the method of the invention show excellent resistivity values in the order of $0.3\Omega$ per via hole.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

We claim:

1. Method of making via holes in a double-layer insulation, comprising the following steps:
   (1) applying a first insulation layer (7) of inorganic material onto a substrate with a first layer of metallurgy (6);
   (2) applying a second insulation layer (8) of polymeric material onto the first insulation layer (7);
   (3) applying a layer (9) of positive photoresist on the double layer (7, 8) and pre-baking;
   (4) image-wise exposing of the photoresist layer (9) and subsequently blanket exposing thereof, and post-baking;
   (5) developing the photoresist layer (9) with a basic developer;
   (6) reactive ion etching (RIE) with a first etching gas of approximately ⅔ to ¾ of the thickness of the second insulation layer (8) in the areas of the respective via holes exposed by the photoresist mask;
   (7) RIE with a second etching gas for completely removing the second insulation layer (8) in the areas exposed by the mask, with the first insulation layer (7) serving as an etch stop;
   (8) RIE with the first etching gas approximately half the thickness of the first insulation layer (7);
   (9) RIE with the second etching gas to effect via the angle of the resist a lateral shifting of the photoresist (9) and of the second insulation layer (8);
   (10) RIE with the first etching gas of the second half of the first insulation layer (7);
   (11) RIE with the second etching gas to effect via the angle of the resist a lateral shifting of the photoresist (9) and of the second insulation layer (8); and
   (12) stripping the residual photoresist (9).

2. Method as claimed in claim 1, characterized in that as first insulation layer a silicon nitride layer (7) conformal with all wafer topographies.

3. Method as claimed in claim 2, characterized in that the silicon nitride layer has a thickness between approximately 0.2 and 0.8 μm.

4. Method as claimed in claim 1, characterized in that as second insulation layer a planarizing polyimide layer (8).

5. Method as claimed in claim 4, characterized in that the polyimide layer has a thickness of approximately 0.8 to 2 μm.

6. Method as claimed in claim 1, characterized in that the positive photoresist is a positive photoresist (9) on Novolak basis with a diazonaphthoquinone inhibitor and is applied with a thickness of approximately 3 to 5 μm.

7. Method as claimed in claim 1 characterized in that the image-wise exposing and blanket exposing of the photoresist layer is performed with a radiation wave length of 436 nm or less.

8. Method as claimed in claim 1, characterized in that the slope angle of the photoresist edges is controlled via the ratio of blanket to image-wise exposure duration.

9. Method as claimed in claim 8, characterized in that the ratio of blanket to image-wise exposure duration is between approximately 1:2.0 and 1:5.

10. Method as claimed in claim 9, characterized in that the ratio of blanket to image-wise exposure is 1:2.5.

11. Method as claimed in claim 1, characterized in that the photoresist layer is pre-baked prior to exposure for approximately 20 minutes at approximately 85° C., and post-baked after blanket irradiation for approximately 10 minutes at approximately 105° C.

12. Method as claimed in claim 1 characterized in that as a first etching gas $CF_4$ is used, and as a second etching gas oxygen is used.

13. Method as claimed in claim 12, characterized in that the RIE of the first and second insulation layers in $CF_4$ is decoupled by an RIE etching step in oxygen.

14. Method as claimed in claim 1, characterized in that the etching rate ratio of photoresist to the second insulation layer is approximately 1:1.

15. Method as claimed in claim 13, characterized in that the RIE etching step of the second insulation layer in oxygen is performed at a pressure less than or equal to 100 μbar.

16. Method as claimed in claim 1, characterized in that after step (12), the method further characterized by depositing a second layer of metallurgy.

17. Method as claimed in claim 16, characterized in that Ti-Al-Cu is the second layer of metallurgy.

* * * * *